(12) United States Patent
Kim et al.

(10) Patent No.: US 12,726,189 B2
(45) Date of Patent: Sep. 1, 2026

(54) ADAPTIVE COMPARATOR CALIBRATION

(71) Applicant: Credo Technology Group Limited, Grand Cayman (KY)

(72) Inventors: Kyungjin Kim, San Jose, CA (US); Haihui Luo, Saratoga, CA (US); Shunken Huang, Hsinchu (TW); Junqing Sun, Cupertino, CA (US)

(73) Assignee: Credo Technology Group Limited (KY)

( * ) Notice: Subject to any disclaimer, the term of this patent is extended or adjusted under 35 U.S.C. 154(b) by 92 days.

(21) Appl. No.: 18/596,953

(22) Filed: Mar. 6, 2024

(65) Prior Publication Data

US 2025/0286545 A1 Sep. 11, 2025

(51) Int. Cl.
*H03M 1/10* (2006.01)
*H03K 5/22* (2006.01)
*H03M 1/12* (2006.01)

(52) U.S. Cl.
CPC ................ *H03K 5/22* (2013.01); *H03M 1/12* (2013.01)

(58) Field of Classification Search
CPC .. H03M 1/1009; H03M 1/1023; H03M 1/361; H03M 1/12; H03M 1/1245; H03M 1/365; H03M 1/00; H03M 1/1061; H03M 1/34; H03M 1/06; H03M 1/1004; H03M 1/362; H03M 1/468; H03M 1/0673; H03M 1/069; H03M 1/1057; H03M 1/124; H03M 1/125; H03M 1/204; H03M 1/40; H03M 1/403; H03M 1/44; H03M 1/466; H03M 1/48; H03M 1/66; H03M 1/0607; H03M 1/0617; H03M 1/0621; H03M 1/0626;

(Continued)

(56) References Cited

U.S. PATENT DOCUMENTS 5,861,829 A * 1/1999 Sutardja .............. H03M 1/1061 341/122
7,994,960 B1 * 8/2011 Li ....................... H03M 1/0678 341/158

(Continued)

OTHER PUBLICATIONS

Feyyaz Melih Akcakaya, Gunhan Dundar, "Low power 3rd order feedforward sigma delta ADC design", Turkish Journal of Electrical Engineering & Computer Sciences, Jan. 24, 2017, pp. 155-162, Istanbul/Turkey.

(Continued)

*Primary Examiner* — Linh V Nguyen
(74) *Attorney, Agent, or Firm* — Daniel J. Krueger; Ramey LLP

(57) ABSTRACT

Flash analog to digital converters and other types of integrated circuits having multiple comparators may employ calibration methods and firmware to efficiently compensate the various offset voltages of the multiple comparators. One illustrative integrated circuit includes: multiple comparators each configured to provide a comparator output signal indicating whether an input signal exceeds a reference voltage by more than an offset voltage, the multiple comparators including a current comparator and a previous comparator; and a controller configured to perform a search to select a calibration setting for each of the comparators in turn, the controller determining an initial search window for the current comparator based on a calibration setting selected for the previous comparator.

20 Claims, 5 Drawing Sheets

(58) Field of Classification Search
CPC ............. H03M 1/0631; H03M 1/0641; H03M 1/0646; H03M 1/066; H03M 1/0675; H03M 1/0678; H03M 1/08; H03M 1/089; H03M 1/1014; H03M 1/1038; H03M 1/121; H03M 1/1215; H03M 1/141; H03M 1/164; H03M 1/165; H03M 1/167; H03M 1/205; H03M 1/36; H03M 1/363; H03M 1/38; H03M 1/42; H03M 1/442; H03M 1/445; H03M 1/46; H03M 1/462; H03M 1/50; H03M 1/502; H03M 1/74; H03M 1/747; H03M 1/785; H03M 3/328; H03M 3/356; H03M 3/38; H03M 3/384; H03M 3/388; H03M 3/414; H03M 3/422; H03M 3/424; H03M 3/43; H03M 3/436; H03M 3/452; H03M 3/454; H03M 3/458; H03M 3/47; H03M 3/50; H03M 3/504
USPC .......................................... 341/118, 120, 155
See application file for complete search history.

(56) References Cited

U.S. PATENT DOCUMENTS 8,427,353 B2 4/2013 Cheng
9,344,106 B2 * 5/2016 Lai ...................... H03M 1/1009
9,571,115 B1 * 2/2017 Beukema ............ H03M 1/1023
10,411,917 B2 9/2019 Qian et al.
11,163,483 B2 11/2021 Kim et al.
11,418,206 B2 * 8/2022 Huang ................ H03F 3/45188
2009/0195424 A1 * 8/2009 Van Der Plas ..... H03M 1/1061 341/172
2010/0194620 A1 * 8/2010 Kijima ................ H03M 1/0809 341/159
2011/0309961 A1 * 12/2011 Danjo ................. H03M 1/1038 341/158
2012/0176259 A1 * 7/2012 Sanduleanu ........ H03M 1/1061 341/118
2012/0188109 A1 * 7/2012 Sanduleanu ........ H03M 1/1061 341/120
2023/0138266 A1 * 5/2023 K ........................ H03M 1/1009 341/120
2023/0291411 A1 * 9/2023 Liu ..................... H03M 1/1061

OTHER PUBLICATIONS

Richard Palmer, Katherine Li, "DC Parameters: Input Offset Voltage (VOS)", Texas Instruments, Mar. 2023, pp. 1-19.

U.S. Appl. No. 18/387,731 as filed in U.S. Patent and Trademark Office filed Nov. 7, 2023 by inventors Kyungjin Kim, Wenzhe Gao, Alex Nazari, Chad Cohen and Xin Chang, titled: "Serdes With Robust Parameter Initialization".

* cited by examiner 210
310
312
Controller
FW
302
304
306
308
Photodetector
Filter
A/D Converter
Demodulator FIG. 5
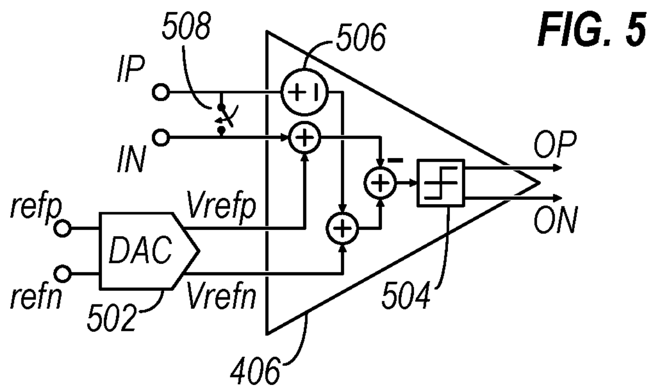
FIG. 6
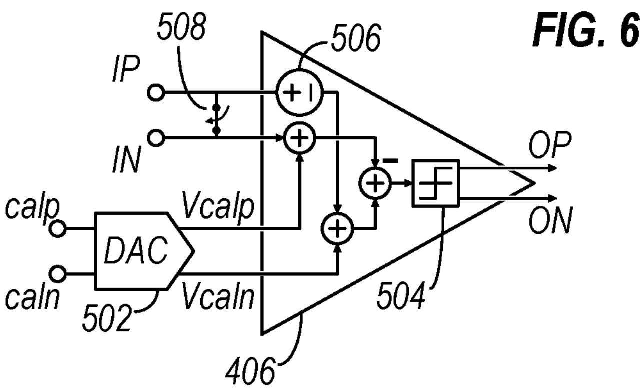
FIG. 7
| Cal Index | CalP | CalN |
|---|---|---|
| 0 | 0 | 127 |
| 1 | 1 | 119 |
| 2 | 1 | 111 |
| 3 | 1 | 103 |
| 4 | 3 | 97 |
| ... | ... | ... |
| N-2 | 119 | 1 |
| N-1 | 127 | 1 |
FIG. 8
| Comparator# | Vref Index | Cal Index |
|---|---|---|
| 0 | 0 | 28 |
| 1 | 0 | 41 |
| 2 | 1 | 19 |
| 3 | 1 | 30 |
| 4 | 2 | 37 |
| ... | ... | ... |
| 90 | 46 | 19 |
| 91 | 46 | 10 |

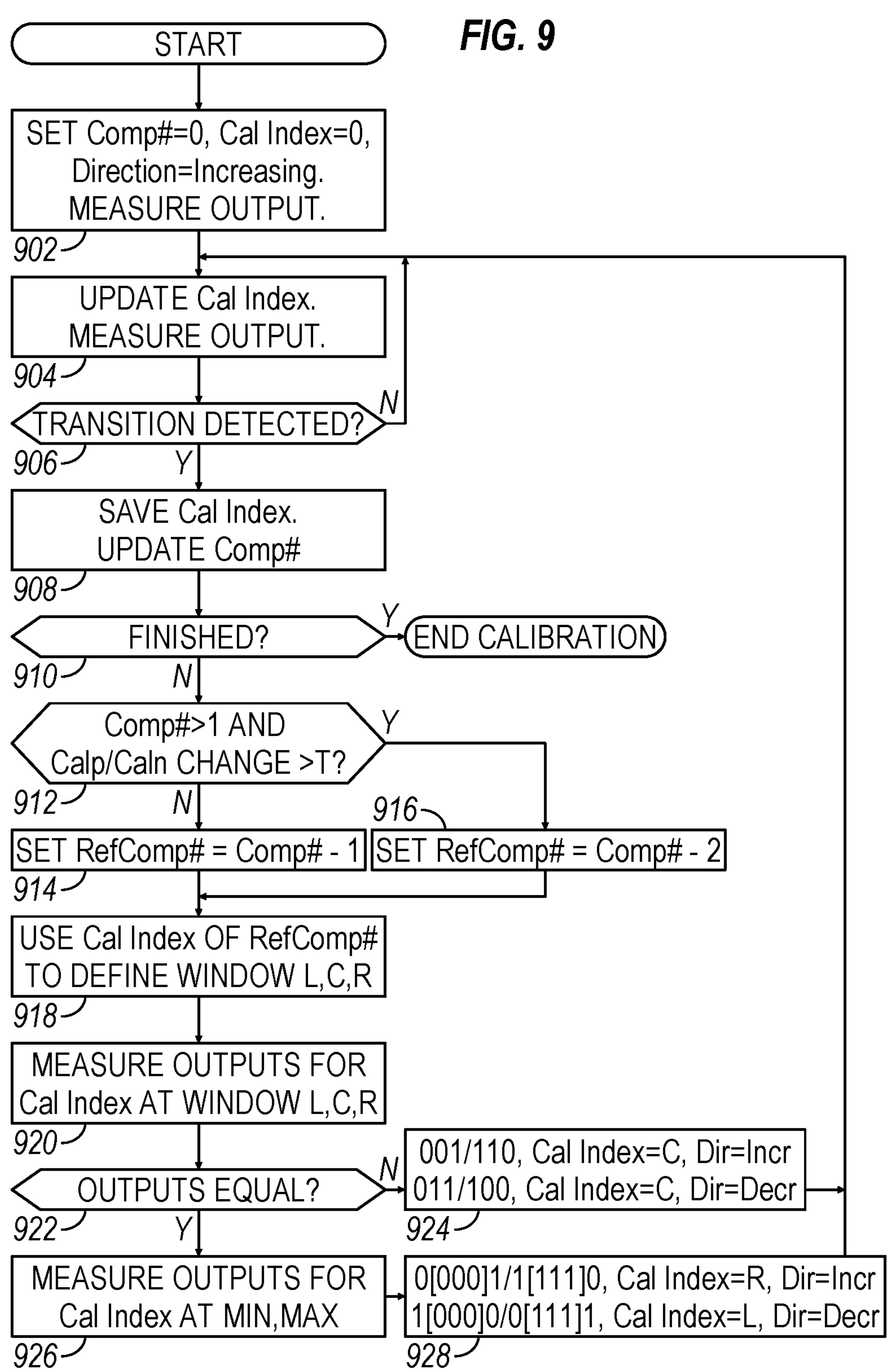
FIG. 9
START
SET Comp#=0, Cal Index=0, Direction=Increasing. MEASURE OUTPUT.
902
UPDATE Cal Index. MEASURE OUTPUT.
904
TRANSITION DETECTED?
N
Y
906
SAVE Cal Index. UPDATE Comp#
908
FINISHED?
Y
END CALIBRATION
910
N
Comp#>1 AND Calp/Caln CHANGE >T?
Y
912
N
916
SET RefComp# = Comp# - 1
SET RefComp# = Comp# - 2
914
USE Cal Index OF RefComp# TO DEFINE WINDOW L,C,R
918
MEASURE OUTPUTS FOR Cal Index AT WINDOW L,C,R
920
OUTPUTS EQUAL?
N
001/110, Cal Index=C, Dir=Incr
011/100, Cal Index=C, Dir=Decr
922
Y
924
MEASURE OUTPUTS FOR Cal Index AT MIN,MAX
0[000]1/1[111]0, Cal Index=R, Dir=Incr
1[000]0/0[111]1, Cal Index=L, Dir=Decr
926
928

ADAPTIVE COMPARATOR CALIBRATION

BACKGROUND

Digital communications occur between sending and receiving devices over an intermediate communications medium, or "channel" (e.g., a fiber optic cable, insulated copper wire, or a wireless connection). Each sending device typically transmits symbols at a fixed symbol rate, while each receiving device detects a (potentially corrupted) sequence of symbols and attempts to reconstruct the transmitted data. A "symbol" is a state or significant condition of the channel that persists for a fixed period, called a "symbol interval". A symbol may be, for example, an electrical voltage or current level, an optical power level, a phase value, or a particular frequency or wavelength. A change from one channel state to another is called a symbol transition. Each symbol may represent (i.e., encode) one or more binary bits of the data. Alternatively, the data may be represented by symbol transitions, or by a sequence of two or more symbols.

Many digital communication links use only one bit per symbol; a binary '0' is represented by one symbol (e.g., an electrical voltage or current signal within a first range), and binary '1' by another symbol (e.g., an electrical voltage or current signal within a second range), but higher-order signal constellations are known and frequently used. In 4-level pulse amplitude modulation ("PAM4"), each symbol interval may carry any one of four symbols, often denoted as −3, −1, +1, and +3. Two binary bits can thus be represented by each symbol.

Channel non-idealities produce dispersion which may cause each symbol to perturb its neighboring symbols, a consequence termed "inter-symbol interference" ("ISI"). ISI can make it difficult for the receiving device to determine which symbols were sent in each interval, particularly when such ISI is combined with additive noise. Receivers may accordingly employ sophisticated equalization techniques to minimize symbol error rates. It is often advantageous to digitize the receive signals and perform the bulk of the equalization in the digital domain. At high symbol rates, designers may preferentially employ a flash analog to digital converter, which offers fast, accurate conversion.

A flash analog to digital converter uses a linear voltage ladder and a comparator at each "step" in the ladder. The comparators operate in parallel to compare the input voltage to each of the reference voltages. Often these ladders are constructed of a series of resistors, but capacitive voltage division is also possible as is a set of programmable voltage sources to provide tailored reference voltages. Flash converters are extremely fast, but they require many comparators relative to other analog to digital converter implementations. A flash converter requires $2^n-1$ comparators for an n-bit conversion. (The output of these $2^n-1$ comparators can be fed into a digital encoder which converts the comparator outputs into an n-bit binary number representation.)

The Institute of Electrical and Electronics Engineers (IEEE) has published IEEE Std 802.3ba-2010, a standard which provides for Ethernet communications at rates as high as 100 Gb/s. The standard specifies multiple channels each having a symbol signaling rate as high as 25 Gb/s. Since the fundamental limit for transistor switching in the 65 nm silicon integrated circuit manufacturing process is below 40 GHz, the new IEEE standard places high demands indeed on the implementation of the analog to digital converter. For additional detail, see co-owned U.S. Pat. No. 8,427,353, "A High-Speed Flash Analog to Digital Converter", which is hereby incorporated herein by reference. Additional channels may necessitate additional flash ADCs and at higher symbol rates each flash ADC may need to be parallelized to permit interleaved operations, even further increasing the number of comparators.

To make the situation even more challenging, the chosen receiver design must cope with potential changes in performance of its components due to process variation, supply voltage variation, and temperature variation (collectively, "PVT variations") as well as drift due to component aging. Comparators may exhibit such changes as a change in voltage offsets, adversely affecting symbol error rate and overall system performance. Periodic calibration of the comparators enables compensation of such voltage offset changes if it can be performed precisely, but receiver is unable to operate while the calibration is being performed. It is accordingly desirable to minimize calibration time to maximize receiver throughput while also maintaining precision of the calibration process.

SUMMARY

Accordingly, there are disclosed herein flash analog to digital converters and other types of integrated circuits that calibrate multiple comparators, as well as methods and firmware for such integrated circuits to perform calibration of their multiple comparators. One illustrative integrated circuit includes: multiple comparators each configured to provide a comparator output signal indicating whether an input signal exceeds a reference voltage by more than an offset voltage, the multiple comparators including a current comparator and a previous comparator; and a controller configured to perform a search to select a calibration setting for each of the comparators in turn, the controller determining an initial search window for the current comparator based on a calibration setting selected for the previous comparator.

An illustrative calibration method for use in such an integrated circuit includes: determining an initial search window for the current comparator based on a calibration setting selected for the previous comparator, the search window having a left side (corresponding to a more negative difference in calibration voltages Vcalp−Vcaln), a right side (corresponding to a more positive difference in calibration voltages Vcalp−Vcaln), and an intermediate point, the intermediate point corresponding to the calibration setting selected for the previous comparator; finding the comparator output signal for the current comparator with the calibration setting at the left side and at the right side of the initial search window; determining a refined search window for the current comparator based at least in part on the comparator output signals for the current comparator at the calibration settings at the left side and at the right side; sequentially trying each calibration setting in the refined search window until a transition in the comparator output signal for the current comparator is detected; and selecting the calibration setting that corresponds to the transition.

An illustrative nontransient information storage medium such as a nonvolatile memory may be coupled to a controller to provide firmware configuring the controller to implement the above calibration method.

Each of the foregoing may be implemented individually or conjointly, together with any one or more of the following features in any suitable combination: 1. the previous comparator is immediately previous to the current comparator only if the previous comparator is a first comparator or a calibration setting difference between two immediately previous comparators is less than a predetermined threshold. 2. the initial search window has a left side, an intermediate point, and a right side, and the intermediate point corresponds to the calibration setting selected for the previous comparator. 3. the controller is configured to find the comparator output signal for the current comparator with the calibration setting at the left side and at the right side of the initial search window. 4. if the comparator output signals for the current comparator are equal with the calibration setting at the left side and at the calibration setting at the right side, the controller is further configured to find the comparator output signal for the current comparator with the calibration setting at a minimum setting and at a maximum setting. 5. if the comparator output signals for the current comparator are different with the calibration setting at the minimum setting and at the left side, the controller determines a refined search window between the minimum setting and the left side, and if the comparator output signals for the current comparator are different with the calibration setting at the maximum setting and at the right side, the controller determines a refined search window between the right side and the maximum setting. 6. the controller is configured to find the comparator output signal for the current comparator at the intermediate point. 7. if the comparator output signals for the current comparator are different with the calibration setting at the left side and the intermediate point, the controller determines a refined search window between the left side and the intermediate point, and if the comparator output signals for the current comparator are different with the calibration setting at the intermediate point and at the right side, the controller determines a refined search window between the intermediate point and the right side. 8. the controller is configured to sequentially try each calibration setting in the refined search window until a transition in the comparator output signal for the current comparator is detected. 9. the controller is configured to select the calibration setting that causes the transition. 10 the input signal for the current comparator is a differential signal, the reference voltage for the current comparator is provided as a differential signal, the controller is configured to couple differential signal leads of the input signal during the search for the calibration setting of the current comparator, and the controller is configured to adjust the reference voltage for the current comparator based on the selected calibration setting to compensate for the offset voltage. 11. the controller is configured to couple leads of the input signal and the reference voltage of the current comparator during the search for the calibration setting of the current comparator. 12. the integrated circuit further comprises an adjustable voltage source for each of the multiple comparators to convert the selected calibration setting into a calibration voltage that compensates for the offset voltage of that comparator. 13. the integrated circuit includes a flash analog to digital converter with the multiple comparators coupled to receive a shared input signal that is to be digitized.

BRIEF DESCRIPTION OF THE DRAWINGS

FIG. 5 is a schematic of an illustrative comparator.

FIG. 6 is a schematic of an illustrative comparator during calibration.

FIG. 7 is an illustrative calibration table.

FIG. 8 is an illustrative table of calibration settings for multiple comparators.

FIG. 9 is a flow diagram of an illustrative calibration method.

DETAILED DESCRIPTION

Figure 1:
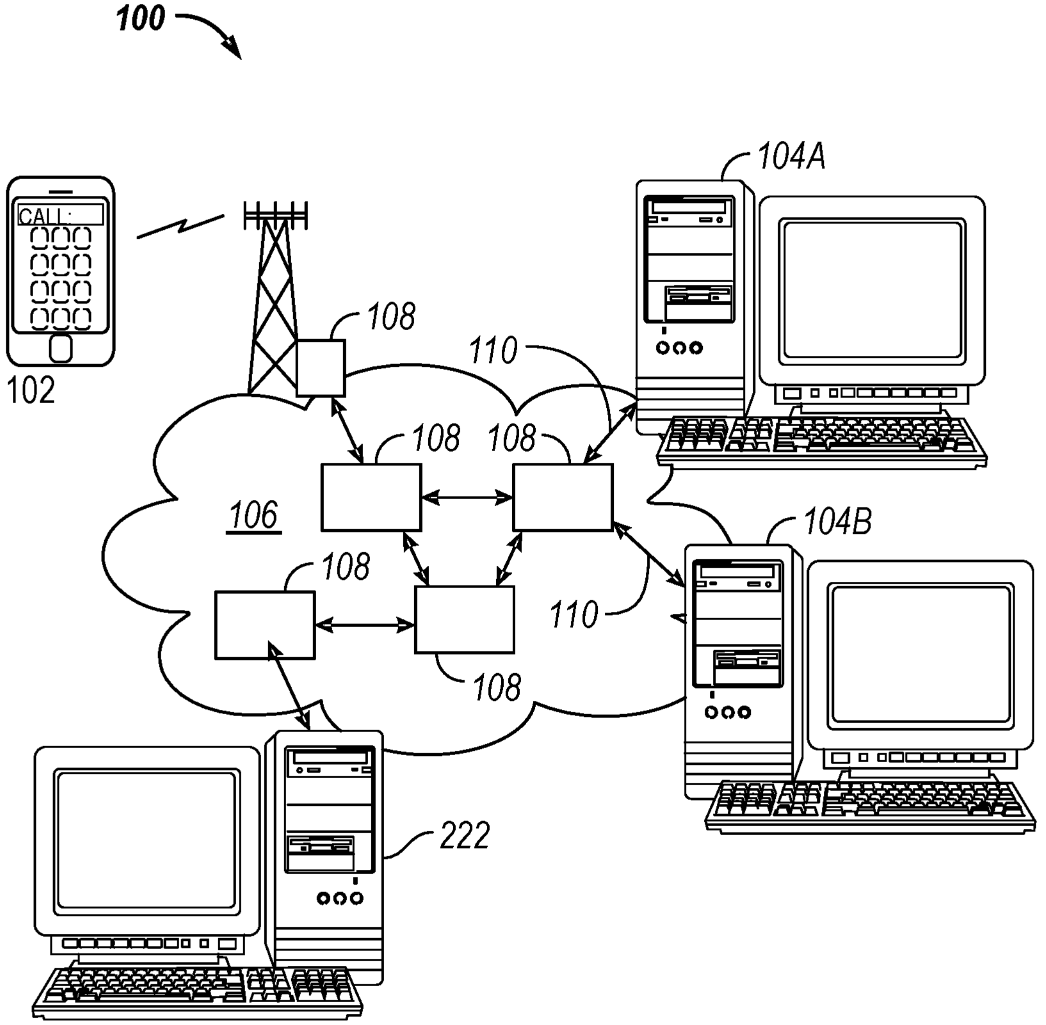
FIG. 1 shows an illustrative computer network.

Note that the specific embodiments given in the drawings and following description do not limit the disclosure. On the contrary, they provide the foundation for one of ordinary skill to discern the alternative forms, equivalents, and modifications that are encompassed in the claim scope.

The disclosed integrated circuits, analog-to-digital converters, and comparator calibration methods are best understood in terms of the environment in which they may be expected to operate. Accordingly, FIG. 1 shows an illustrative computer network 100 including mobile devices 102 and computer systems 104A-C coupled to a routing network 106. The routing network 106 may be or include, for example, the Internet, a wide area network, a local area network, wireless networks, and/or portions of the telephone network. In FIG. 1, the routing network 106 includes a network of equipment items 108, such as switches, routers, hubs, bridges and the like. The equipment items 108 are connected to one another, and to the computer systems 104A-C, via point-to-point communication links 110 that transport data between the various network components. Today, more and more communication links are being developed with an emphasis on speed. IEEE Std 802.3ba-2010 supports sending Ethernet frames at 40 and 100 gigabits per second, with individual channel signaling rates as high as 25 Gb/s.

Figures 2, 3:
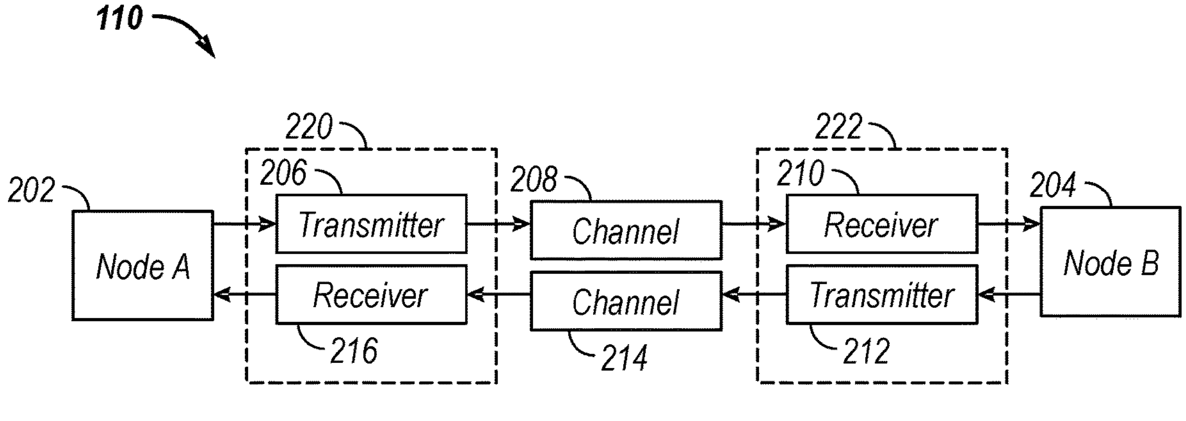
FIG. 2 is a block diagram of an illustrative point-to-point communication link.
FIG. 3 is a block diagram of an illustrative integrated circuit receiver device.

FIG. 2 shows a representative point-to-point communication link 110 of FIG. 1. In the embodiment of FIG. 2, the point-to-point communication link 110 includes a "Node A" 202 at one end, and a "Node B" 204 at an opposite end. Node A may be, for example, one of the equipment items 108 of the computer network 100 of FIG. 1, or one of the computer systems 104A-C. Node B may be, for example, a different one of the equipment items 108, or a different one of the computer systems 104A-C.

Coupled to Node A is a transceiver 220 and coupled to Node B is a transceiver 222. Communication channels 208 and 214 extend between the transceivers 220 and 222. The channels 208 and 214 may include transmission media such as, for example, fiber optic cables, twisted pair wires, coaxial cables, and (in the case of wireless transmission) air. Bidirectional communication between Node A and Node B can be provided using separate channels 208 and 214, or in some embodiments, a single channel that transports signals in opposing directions without interference.

A transmitter 206 of the transceiver 220 obtains data from Node A and transmits the data to the transceiver 222 via a signal on the channel 208. The signal may be, for example, an electrical voltage, an electrical current, an optical power level, a wavelength, a frequency, or a phase value. A receiver 210 of the transceiver 222 receives the signal via the channel 208, uses the signal to reconstruct the transmitted data, and provides the data to Node B. Similarly, a transmitter 212 of the transceiver 222 obtains data from Node B and transmits the data to the transceiver 220 via a signal on the channel 214. A receiver 216 of the transceiver 220 receives the signal via the channel 214, uses the signal to reconstruct the transmitted data, and provides the data to Node A.

As the bandwidth requirements for communication links continue to increase, many system engineers are turning to fiber optic communication channels. While the optical fiber must support the necessary communications bandwidth, the primary difficulty has been in the design of transmitters and receivers (transceivers) that can support these data rates. Existing systems employ an optical transmitter to convert an electrical signal into an optical signal for transmission over the optical fiber, and an optical receiver to receive fiber optic signals and convert them into electrical data signals.

FIG. 3 shows an illustrative receiver 210 for receiving fiber optic signals. The illustrative receiver 210 includes a photodetector 302, a filter 304, an analog to digital converter 306, and a demodulator 308. The photodetector 302 converts an optical signal into a corresponding electrical signal to be processed by the filter 304, analog to digital converter 306, and demodulator 308. While many suitable photodetectors exist and can be used, most existing systems employ one or more photodiodes or phototransistors that change their conductivity when photons enter the sensitive regions of the device. The filter 304 receives the electrical signal from the photodetector 302 and limits the signal to a frequency band of interest to prevent aliasing during the digitization process. Because the filter 304 is analog, it is generally kept uncomplicated, but this is not a requirement. If desired, filter 304 can be designed to at least partially compensate for characteristics of the channel, including spectral responses of the transmitter and photodetector. Alternatively, the filter 304 can be designed to change the spectrum of the received signal to a desired shape such as, e.g., that of a partial response (PR) channel. The analog to digital converter 306 digitizes the filtered signal to provide a stream of digitized signal samples to the demodulator 308. The demodulator 308 converts the digitized signal samples into the digital data stream conveyed by the optical signal.

The transceiver 222 further includes a controller 310 that configures and coordinates the operation of the receiver 210 and transmitter 212. Typically, the controller 310 is programmable and operates on firmware instructions stored in a nonvolatile memory 312, enabling the operation of the controller 310 and hence the transceiver 222 to be readily modified via an update to the firmware. The firmware can implement a boot up routine when power is applied to the transceiver to initialize various operating parameters of the receiver 210 and transmitter 212. This boot up routine may include, e.g., a calibration process for the analog to digital converter 306 as described below. The firmware can also be stored by other nontransient information storage mediums that need not be directly connected to the controller.

Figure 4:
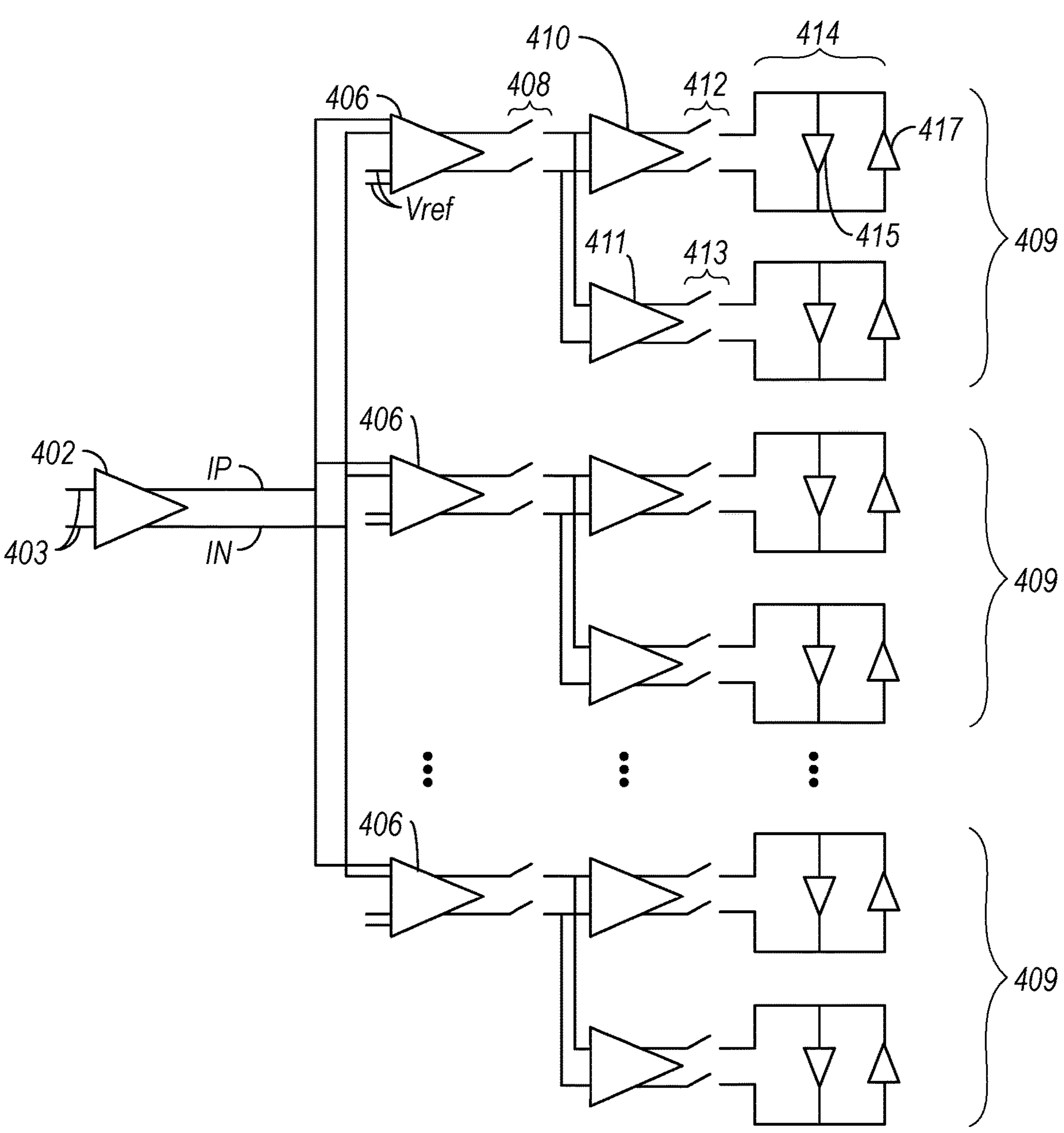
FIG. 4 is a block diagram of an illustrative flash analog to digital converter (ADC).

Analog to digital converter 306 may be a flash analog to digital converter such as that shown in FIG. 4. Such converters employ multiple comparators operating in parallel to compare an input voltage to a set of reference voltages. A digital encoder can be used to convert the comparator outputs to a binary number representation of the voltage.

In FIG. 4, a gain control amplifier 402 applies an adjustable gain to a differential receive signal 403, yielding a differential input signal IP, IN for each of multiple comparators 406. The adjustable gain of gain control amplifier 402 is adapted as needed to maintain the input signal range within the desired limits.

The multiple comparators 406 each compare the differential input signal IP, IN to a respective reference voltage Vref, which may be provided as a differential voltage as shown here, to produce a comparator output signal indicating whether the input signal exceeds the respective reference voltage. (As discussed further below, each comparator may have an inherent offset voltage that impacts the comparison result.) The reference voltages may be evenly or strategically spaced across the expected input signal range such that the comparator output signals collectively indicate the nearest digital representation of the input signal voltage. The comparator outputs may be differential, i.e., complementary digital signals, to facilitate faster sampling.

Sampling gates 408 couple the comparator output signals to a set of latches 409 to sample the comparator output signals in accordance with a sampling clock. The sampling gates may be implemented as NMOS (n-channel metal oxide semiconductor) transistors. The parasitic input capacitance of the latches 409 may cooperate with the sampling gates to provide a sample-and-hold functionality.

Each of the illustrated latches 409 includes one or more latch drivers 410, 411 that, when their respective access switches 412, 413 are closed, set, or reset the associated bistable circuit 414. The access switches 412, 413, may operate in an interleaved fashion such that, e.g., the even numbered access gates close for even-numbered time samples and the odd numbered access gates close for odd-numbered time samples. Such interleaving provides additional settling time for the bistable circuits 414. Higher degrees of interleaving can be employed, e.g., four-phase interleaving such that each bistable circuit 414 captures every fourth sample of the comparator output, permitting even more settling time for each bistable circuit. The illustrated bistable circuits consist of a pair of nose-to-tail inverters 415, 417 that can hold the binary comparator output until a digital encoder or other subsequent circuit is able to combine, process, or otherwise operate on the collection of comparator outputs.

More detail on this analog to digital converter implementation can be found in incorporated U.S. Pat. No. 8,427,353, "A High-Speed Flash Analog to Digital Converter". Note however that this implementation is illustrative and serves to provide a context for the disclosed comparator calibration method. Other contexts are possible, and the disclosed calibration method is applicable to any integrated circuit having multiple comparators and particularly desirable for those circuits having many such comparators.

FIG. 5 shows an illustrative comparator 406 coupled to a digital to analog converter 502 to receive a differential reference voltage on leads labeled here as Vrefp and Vrefn. The Vrefp voltage is an analog voltage corresponding to the digital refp input, while the Vrefn voltage is an analog voltage corresponding to the digital refn input. The comparator 406 includes a sign element 504 that, under ideal conditions, indicates whether ((IP−IN)−(Vrefp−Vrefn)) is greater or less than zero. If greater, output signal OP is high and ON is low. If less than zero, OP is low and ON is high. In practice, PVT variations and component drift introduce an offset voltage Voff 506, causing the sign element 504 to indicate whether ((IP−IN)−(Vrefp−Vrefn)) is greater or less than Voff, or equivalently, whether ((IP−IN)−(Vrefp−Vrefn+Voff))>0.

The controller 310 performs a calibration process to determine the offset voltage and to provide compensation enabling the comparators to perform closer to their ideal. An input shorting switch 508 may be provided for each comparator 406, enabling the controller 310 to short the input IP, IN leads during the calibration process as shown in FIG. 6. The controller 310 may then apply calibration values calp, caln to the digital to analog converter 502, testing different values of Vcalp, Vcaln until a transition point is detected in the output of the sign element 504. At this transition point, Voff=−(Vcalp−Vcaln).

The nonvolatile memory 312 may contain a table of indexed calibration settings each having a predetermined value for calp and caln corresponding to evenly or strategically spaced values of (Vcalp−Vcaln). See FIG. 7, which shows a table of calibration indices with lower indices corresponding to lower calp values and higher caln values. As the calibration index increases, the caln values gradually decrease and the calp values gradually increase, causing a gradual increase in the calibration voltage difference (Vcalp−Vcaln). When discussing search windows below, the smaller calibration index values correspond to the smaller (more negative) calibration voltage difference and may be visualized on the left side, whereas the larger calibration indices correspond to the larger (more positive) calibration voltage differences and may be visualized on the right side.

The nonvolatile memory 312 may also contain a similar table of indexed reference voltage settings to specify Vrefp and Vrefn settings for the desired reference voltages of the various comparators. In an alternative implementation, the reference voltages for the comparators are supplied on the IN leads, the input signal is supplied as a single-ended signal via the IP lead, and the remaining leads are reserved for the calibration voltages Vcalp, Vcaln. In either case, the result of calibration process may take the form of selected calibration settings stored in a table such as that shown in FIG. 8.

Each row of the FIG. 8 table corresponds to a different one of the multiple comparators 406. In this example the integrated circuit includes two flash analog to digital converters each having comparators for 46 different reference voltages represented here by indexed reference voltage settings. The selected calibration settings are represented by the stored calibration index in the last column.

In one contemplated integrated circuit receiver, the integrated circuit includes 192 comparators and an indexed calibration settings table with 72 rows. Even if the controller requires no more than 100 microseconds to test a given calibration setting for a given comparator, an exhaustive search for the optimal calibration settings would require well more than 1 second. As the calibration may need to be regularly repeated for optimal system performance, such a delay represents an undesirable loss of channel capacity. In endeavoring to reduce the time required by the calibration process, the inventors have noted that the selected calibration settings tend to be nearer the middle of their range than to the edges of their range, making it less desirable to start the search at the edges of the calibration range. Moreover, there is a degree of correlation among the selected calibration settings for a given device. The calibration process disclosed here with reference to FIG. 9 exploits these observations to substantially shorten the average time required for the calibration process.

The process begins in block 902 with the controller selecting an initial comparator, setting the initial calibration index to zero, and setting the search direction to "increasing". The selected comparator's output signal is measured with the calp and caln set in accordance with the current calibration index.

In block 904 the controller updates the current calibration index. Since the search direction is "increasing", the calibration index is incremented. If the search direction were "decreasing", the calibration index would be decremented. The controller measures the comparator output signal with the calp and caln set in accordance with the updated calibration index.

In block 906, the controller determines whether the comparator output signal transitioned as compared with the output for the previous calibration index. If not, the controller returns to block 904. Otherwise, in block 906, the controller selects the current calibration index by, e.g., saving the current calibration index in the appropriate row of a table of selected calibration settings (e.g., FIG. 8). The controller then selects the next comparator.

In block 908, the controller determines whether calibration settings have been selected for all comparators. If so, the calibration process is complete. If not, then in block 912 the comparator determines whether the currently selected comparator is one of the first two such that no more than one calibration setting has been selected. If not, and if the last two calibration indexes (or alternatively, if the last two digital calp or caln values) are different by more than a threshold value T, potentially indicating that the most recently selected calibration setting is an outlier. The threshold T may be determined empirically, but contemplated values for the indexes correspond to approximately 50% or 60% of the range. For the calp or caln values, the maximum difference may be compared to the threshold T, with T being 60% to 80% of the maximum value. If a last selected calibration index is not detected as a potential outlier, the controller in block 914 uses the last selected calibration index as a reference, e.g., by setting the reference comparator number to the previous comparator number. Otherwise, in block 916, the controller uses the previous-to-last selected calibration index as a reference, e.g., by setting the reference comparator number to two less than the current comparator number.

In block 918, the controller determines an initial search window to find the best calibration setting for the current comparator. The initial search window has a left side (L), a right side (R), and an intermediate point such as, e.g., the center (C). The intermediate point may be set equal to the index of the selected calibration setting for the reference comparator. The controller may add and subtract a predetermined half-width to the intermediate point to find the initial search window's left and right sides. The half-width may be an empirically determined value, e.g., about 25% of the index range. If the calculated left side or right side is outside the index range, it may be adjusted to equal the nearest edge of the index range.

In block 920, the controller measures the current comparator's output signals with the calibration setting at the left side of the search window, the right side of the search window, and at the intermediate point. In block 922, the controller determines whether the output signals are equal for all three points (or at least for the left and right sides). If not, the comparator output signal transitions within the initial search window on either the left or right side of the intermediate point. Accordingly, in block 924, the controller determines a refined search window between the intermediate point and whichever side of the initial search window has a different comparator output signal than the intermediate point. This can be done, e.g., by setting the calibration index equal to the intermediate point and selecting the appropriate search direction, i.e., increasing or decreasing.

If in block 922, the controller determines the comparator output signals are all equal, the comparator output signal does not transition within the initial search window. Accordingly in block 926 the controller measures the current comparator's output signals with the calibration setting set at its minimum and maximum values, one of which should be unequal to the output signal state within the search window. In block 928, the controller determines the refined search window to be between the search window side nearest the unequal comparator output signal and the extreme index that yielded the unequal value. From blocks 924 or 928, the controller returns to block 904 to search for the transition within the refined search window.

Numerous alternative forms, equivalents, and modifications will become apparent to those skilled in the art once the above disclosure is fully appreciated. The order of operations described in the flow diagram can be varied, with certain operations being reordered, pipelined and/or performed in parallel. It is intended that the claims be interpreted to embrace all such alternative forms, equivalents, and modifications where applicable.

What is claimed is:

1. An integrated circuit that comprises:

multiple comparators each configured to provide a comparator output signal indicating whether an input signal exceeds a reference voltage by more than an offset voltage, the multiple comparators including a current comparator and a previous comparator; and a controller configured to perform a search to select a calibration setting for each of the comparators in turn, the controller determining an initial search window customized for the current comparator based on a calibration setting selected for the previous comparator.

2. The integrated circuit of claim 1, wherein the previous comparator is immediately previous to the current comparator only if the previous comparator is a first comparator or a calibration setting difference between two immediately previous comparators is less than a predetermined threshold.

3. The integrated circuit of claim 1, wherein the initial search window has a left side, an intermediate point, and a right side, and wherein the intermediate point corresponds to the calibration setting selected for the previous comparator.

4. The integrated circuit of claim 3, wherein the controller is configured to find the comparator output signal for the current comparator with the calibration setting at the left side and at the right side of the initial search window.

5. The integrated circuit of claim 4, wherein if the comparator output signals for the current comparator are equal with the calibration setting at the left side and at the calibration setting at the right side, the controller is further configured to find the comparator output signal for the current comparator with the calibration setting at a minimum setting and at a maximum setting, wherein if the comparator output signals for the current comparator are different with the calibration setting at the minimum setting and at the left side, the controller determines a refined search window between the minimum setting and the left side, and wherein if the comparator output signals for the current comparator are different with the calibration setting at the maximum setting and at the right side, the controller determines a refined search window between the right side and the maximum setting.

6. The integrated circuit of claim 4, wherein the controller is configured to find the comparator output signal for the current comparator at the intermediate point, wherein if the comparator output signals for the current comparator are different with the calibration setting at the left side and the intermediate point, the controller determines a refined search window between the left side and the intermediate point, and wherein if the comparator output signals for the current comparator are different with the calibration setting at the intermediate point and at the right side, the controller determines a refined search window between the intermediate point and the right side.

7. The integrated circuit of claim 6, wherein the controller is configured to sequentially try each calibration setting in the refined search window until a transition in the comparator output signal for the current comparator is detected, and wherein the controller is configured to select the calibration setting that causes the transition.

8. The integrated circuit of claim 1, wherein the input signal for the current comparator is a differential signal, wherein the reference voltage for the current comparator is provided as a differential signal, wherein the controller is configured to couple differential signal leads of the input signal during the search for the calibration setting of the current comparator, and wherein the controller is configured to adjust the reference voltage for the current comparator based on the selected calibration setting to compensate for the offset voltage.

9. The integrated circuit of claim 1, wherein the controller is configured to couple leads of the input signal and reference voltage of the current comparator during the search for the calibration setting of the current comparator, and wherein the integrated circuit further comprises an adjustable voltage source for each of the multiple comparators to convert the selected calibration setting into a calibration voltage that compensates for the offset voltage of that comparator.

10. The integrated circuit of claim 1, comprising a flash analog to digital converter with the multiple comparators coupled to receive a shared input signal that is to be digitized.

11. A calibration method for use in an integrated circuit having multiple comparators each configured to provide a comparator output signal indicating whether an input signal exceeds a reference voltage by more than an offset voltage, the multiple comparators including a current comparator and a previous comparator, the method comprising:

determining an initial search window customized for the current comparator based on a calibration setting selected for the previous comparator, the search window having a left side, a right side, and an intermediate point, the intermediate point corresponding to the calibration setting selected for the previous comparator;

finding the comparator output signal for the current comparator with the calibration setting at the left side and at the right side of the initial search window;

determining a refined search window for the current comparator based at least in part on the comparator output signals for the current comparator at the calibration settings at the left side and at the right side;

sequentially trying each calibration setting in the refined search window until a transition in the comparator output signal for the current comparator is detected; and selecting the calibration setting that corresponds to the transition.

12. The calibration method of claim 11, wherein the previous comparator is immediately previous to the current comparator only if the previous comparator is a first comparator or a calibration setting difference between two immediately previous comparators is less than a predetermined threshold.

13. The calibration method of claim 11, wherein said determining a refined search window includes:

if the comparator output signals for the current comparator with the calibration setting at the left side and at the calibration setting at the right side are equal:

finding the comparator output signal for the current comparator with the calibration setting at a minimum setting and at a maximum setting;

determining that the refined search window is between the minimum setting and the left side if the comparator output signals for the current comparator are different with the calibration setting at the minimum setting and at the left side; and determining that the refined search window is between the right side and the maximum setting if the comparator output signals for the current comparator are different with the calibration setting at the right side and at the maximum setting.

14. The calibration method of claim 11, wherein said determining a refined search window includes:

finding the comparator output signal for the current comparator at the intermediate point;

determining that the refined search window is between the left side and the intermediate point if the comparator output signals for the current comparator are different with the calibration setting at the left side and at the intermediate point; and determining that the refined search window is between the intermediate point and the right side if the comparator output signals for the current comparator are different with the calibration setting at the intermediate point and at the right side.

15. The calibration method of claim 11, wherein said sequentially trying is performed while differential signal leads for the input signal are coupled together, and wherein said selecting includes adjusting the reference voltage based on the selected calibration setting to compensate for the offset voltage.

16. The calibration method of claim 11, wherein said sequentially trying is performed while signal leads for the input signal and the reference voltage are coupled together, and wherein said selecting includes using an adjustable source to convert the selected calibration setting into a calibration voltage that compensates for the offset voltage.

17. A nontransient information storage medium coupled to a controller to provide firmware that configures the controller to implement a calibration method for multiple comparators including a previous comparator and a current comparator, each of the multiple comparators being configured to provide a comparator output signal indicating whether an input signal exceeds a reference voltage by more than an offset voltage, the calibration method comprising:

determining an initial search window customized for the current comparator based on a calibration setting selected for the previous comparator, the search window having a left side, a right side, and an intermediate point, the intermediate point corresponding to the calibration setting selected for the previous comparator;

finding the comparator output signal for the current comparator with the calibration setting at the left side and at the right side of the initial search window;

determining a refined search window for the current comparator based at least in part on the comparator output signals for the current comparator at the calibration settings at the left side and at the right side;

sequentially trying each calibration setting in the refined search window until a transition in the comparator output signal for the current comparator is detected; and selecting the calibration setting that corresponds to the transition.

18. The nontransient information storage medium of claim 17, wherein the previous comparator is immediately previous to the current comparator only if the previous comparator is a first comparator or a calibration setting difference between two immediately previous comparators is less than a predetermined threshold.

19. The nontransient information storage medium of claim 17, wherein said determining a refined search window includes:

if the comparator output signals for the current comparator with the calibration setting at the left side and at the calibration setting at the right side are equal:

finding the comparator output signal for the current comparator with the calibration setting at a minimum setting and at a maximum setting;

determining that the refined search window is between the minimum setting and the left side if the comparator output signals for the current comparator are different with the calibration setting at the minimum setting and at the left side; and determining that the refined search window is between the right side and the maximum setting if the comparator output signals for the current comparator are different with the calibration setting at the right side and at the maximum setting.

20. The nontransient information storage medium of claim 17, wherein said determining a refined search window includes:

finding the comparator output signal for the current comparator at the intermediate point;

determining that the refined search window is between the left side and the intermediate point if the comparator output signals for the current comparator are different with the calibration setting at the left side and at the intermediate point; and determining that the refined search window is between the intermediate point and the right side if the comparator output signals for the current comparator are different with the calibration setting at the intermediate point and at the right side.

* * * * *